United States Patent
Wiest et al.

(10) Patent No.: US 6,998,222 B2
(45) Date of Patent: Feb. 14, 2006

(54) PRODUCING AN ELECTRICALLY-CONDUCTIVE STRUCTURE ON A NON-PLANAR SURFACE

(75) Inventors: Florian Wiest, Munich (DE); Ignaz Eisele, Icking (DE)

(73) Assignee: Epcos AG, Munich (DE)

( * ) Notice: Subject to any disclaimer, the term of this patent is extended or adjusted under 35 U.S.C. 154(b) by 175 days.

(21) Appl. No.: 10/380,293

(22) PCT Filed: Aug. 17, 2001

(86) PCT No.: PCT/DE01/03166

§ 371 (c)(1),
(2), (4) Date: Mar. 11, 2003

(87) PCT Pub. No.: WO02/23961

PCT Pub. Date: Mar. 21, 2002

(65) Prior Publication Data

US 2004/0096781 A1    May 20, 2004

(51) Int. Cl.
*G03F 7/00* (2006.01)
*G03F 7/20* (2006.01)

(52) U.S. Cl. .................. 430/315; 430/311; 430/313; 430/319; 430/396

(58) Field of Classification Search ............ 430/311, 430/313, 315, 319, 396

See application file for complete search history.

(56) References Cited

U.S. PATENT DOCUMENTS

| | | | |
|---|---|---|---|
| 4,671,854 A | 6/1987 | Ishikawa et al. | 216/18 |
| 4,800,836 A * | 1/1989 | Yamamoto et al. | 118/52 |
| 5,004,672 A | 4/1991 | D'Ottavio et al. | 205/184 |
| 5,168,624 A | 12/1992 | Shirai | 29/846 |
| 5,279,923 A | 1/1994 | Hiro et al. | 430/270.1 |
| 5,494,780 A | 2/1996 | Nakashima et al. | 430/313 |
| 5,686,230 A | 11/1997 | Nellissen | 430/395 |
| 6,096,634 A * | 8/2000 | Nguyen | 438/624 |

FOREIGN PATENT DOCUMENTS

| | | |
|---|---|---|
| CN | 1114820 | 1/1996 |
| DE | 42 39 830 A1 | 6/1993 |
| DE | 198 17 852 A1 | 10/1999 |
| EP | 0 407 951 A2 | 7/1990 |
| JP | 63220249 | 9/1988 |
| JP | 06282062 | 10/1994 |
| JP | 07273432 | 10/1995 |
| JP | 11218938 | 8/1999 |

OTHER PUBLICATIONS

Office Action from corresponding Chinese Application No. 01815517.0, dated Sep. 3, 2004.

* cited by examiner

*Primary Examiner*—Nicole Barreca
(74) *Attorney, Agent, or Firm*—Fish & Richardson P.C.

(57) ABSTRACT

A method for producing an electrically conductive structure on a non-planar surface includes depositing a photosensitive resist coating onto the non-planar surface, exposing the photosensitive resist coating, removing a portion of the photosensitive resist coating, and depositing an electrically-conductive material onto portions of the non-planar surface that is substantially free of the photosensitive resist coating.

20 Claims, 5 Drawing Sheets

PRODUCING AN ELECTRICALLY-CONDUCTIVE STRUCTURE ON A NON-PLANAR SURFACE

CROSS-REFERENCE TO RELATED APPLICATIONS

This application claims priority to PCT Application No. PCT/DE01/03166, filed on Aug. 17, 2001, and to German Patent Application No. 100 45 072.5, filed on Sep. 12, 2000.

FIELD OF THE INVENTION

The invention relates to a method for producing an electrically-conductive structure on a non-planar surface. In a first step, a photosensitive resist coating is applied to the surface. In a second step, the photosensitive resist coating is exposed and structured by development. In a third step, an electrically-conductive material is applied to the parts of the surface that are free of photosensitive resist. In addition, the invention relates to the use of the method.

BACKGROUND

A method of the type described above is known from publication DE 198 17 852 A1, which is used to produce coils of spools with surfaces sloped toward one another. In this process, the photosensitive resist coating is applied to the spools by spraying. Following structuring of the photosensitive resist coating, copper is electrolytically deposited onto the spool, thereby forming the windings of the spool. In this process, the structuring of the photosensitive resist coating is performed using lithography with inclined surfaces.

The drawback of the known method is that the spray application of a photosensitive resist precludes the production of a uniform coating thickness across the entire spool. In particular, the thickness of the coating varies very considerably at contact edges between flat surfaces of the spool. This causes problems during exposure of the photosensitive resist, since different coating thicknesses also require different exposure times. However, varying exposure times can only be achieved at a very high cost.

Another drawback of the known method is that a photosensitive resist coating applied by spraying tends to tear out after hardening, particularly at the contact edges between the flat surfaces of the spool. This can result in short-circuits during subsequent electroplating of the strip conductors.

SUMMARY

The purpose of the present invention, therefore, is to provide a method for producing an electrically-conductive structure on a non-planar surface that permits the processing of a photosensitive resist coating with improved homogeneity.

According to the invention, this objective is achieved by a method according to claim 1. Advantageous embodiments of the inventions and the use of the method may be derived from the remaining claims.

The invention specifies a method, with the following steps, for producing an electrically-conductive structure on a non-planar surface:

a) Electrochemical depositing of a photosensitive resist coating onto the surface b) Exposure of parts of the photosensitive resist coating c) Removal of a part of the photosensitive resist coating by development d) Depositing of an electrically-conductive material on the parts of the surface that are free of the photosensitive resist coating.

Photosensitive resist is a material commonly used in semiconductor technology that can be exposed by light, synchrotron radiation, or electron radiation, and is also referred to as a "resist." An advantage of the method according to the invention is that the electrochemical depositing of suitable photosensitive resist onto the non-planar surface allows for the production of a photosensitive resist coating with a highly homogenous coating thickness.

Another advantage of the method according to the invention is that a photosensitive resist coating deposited by means of electrochemical depositing exhibits only a minor tendency to develop tears at contact edges between flat surfaces.

For the electrochemical depositing of the photosensitive resist coating, it is necessary that the surface be electrically-conductive or be provided with an electrically-conductive coating. Such a coating can be deposited by chemical means to achieve a high degree of uniformity for the coating thickness.

Using the method according to the invention, the photosensitive resist can be especially advantageously deposited with a coating thickness that varies by less than 25% across the surface.

In addition, a method according to the invention is advantageous, in which the photosensitive resist coating is deposited with a coating thickness of between 10 and 50 $\mu$m. As a result, the photosensitive resist coating can be produced to a sufficient degree of thickness to satisfy the requirements for production of electrically-conductive structures, which are to represent the windings of a miniaturized coil. If the photosensitive resist were not as thick, it would only be possible to deposit thinner electrically-conductive structures whose resistance is too high for coils.

During execution of the method according to the invention, it is especially advantageous to use a beam cluster with a divergence of <10 mrad during exposure of the photosensitive resist coating. Such beam clusters with low divergence are available, for example, in the form of synchrotron radiation or in the form of laser radiation. They are advantageous in that correction of the varying distances between the non-planar surface and a commonly used flat photolithography mask is not necessary. Greater beam divergence leads, depending on the distance between the photosensitive resist coating and the photolithography mask, to varying enlargement of the structure to be imaged.

Furthermore, a method is especially advantageous in which the exposure of the photosensitive resist coating is performed by imaging a photolithography mask with a transparent mask surface by means of a divergent beam cluster, and in which the mask surface is reduced relative to the corresponding surface on the photosensitive resist coating to be exposed as a factor of the distance between the photosensitive resist and the photolithography mask, thereby counteracting the enlarged image of the mask surface resulting from the divergence of the beam cluster.

The exposure of the photosensitive resist by imaging of a photolithography mask by a divergent beam cluster allows for the use of readily available exposure machines known from semiconductor technology. This is advantageous since, on the one hand, these exposure machines can expose a large surface of up to 20 cm×20 cm, which allows for the uniform exposure of several smaller, non-planar surfaces.

On the other hand, the exposure machines are advantageous because they are relatively inexpensive when compared with synchrotron radiation or laser radiation.

Another advantage of this method is that the enlarged image of the mask surface resulting from the use of a divergent beam cluster can be at least partially corrected.

In addition, the method according to the invention can be used to produce conductive structures. A beam cluster with a divergence angle δ is used. To expose a surface on the photosensitive resist coating that is to have a reference width $b_1$ at a distance d, a mask surface is used whose width $b_2$ at distance d diverges by less than 10% from the width $b_3$, which is calculated using the following formula:

$$b_3 = b_1 - 2 \times d \times \tan \delta.$$

Furthermore, the method according to the invention can be used advantageously to produce an electrically-conductive structure on a surface, which is part of its shell surface, of a body, wherein a body with a longitudinal axis, a shell surface and a face is used, and wherein the body is oriented during exposure in such a way that at least half of the shell surface can be exposed.

The advantage of such a method is that a spool, for example, can be used as the body. As a result of the orientation of the body during exposure, it is possible to cover the entire shell surface of the body with two exposure steps from opposing sides.

It is also advantageous to orient the body during exposure in such a way that the flat surfaces belonging to the shell surface complete an angle of at least 40° with the beam direction of the beam cluster used.

The advantage of this method is that, as a result, an extremely flat angle of incidence of the beam cluster on the photosensitive resist is avoided, which, on the other hand, results in a highly variable coating thickness to be effectively exposed.

It is also advantageous to use, in the method, a body having a cubical shape, whose contact edges between the lateral surfaces of the shell surface are rounded.

The use of a body with a shell surface containing flat lateral surfaces is advantageous, in that linear correction of the varying distance between the photosensitive resist coating and the photolithography mask is sufficient, at least on the flat lateral surfaces. Such linear correction of the mask design is easily achievable as, for example, a rectangle to be exposed on the photosensitive resist coating requires a mask surface in the photolithography mask in the form of a trapezoid.

Furthermore, an advantage of the rounded contact edges is that, as a result, tears in the photosensitive resist coating, as preferably occur at sharp edges, can be essentially avoided.

In addition, the method can be advantageously executed so that the body is exposed from two sides in such a way that the electrically-conductive structure becomes a strip conductor, which runs at least once around the longitudinal axis of the body. This facilitate the production of coils using the method according to the invention.

Furthermore, it is advantageous to use a body that is hooked at its face into a two-dimensional substrate by means of a fastening frame. The hooking of the body to a substrate allows for the use of miniaturized bodies to produce correspondingly small coils, wherein hooking into the substrate facilitates the handling of such a small body.

In addition, the use of a two-dimensional substrate, across the top and bottom sides of which the body does not protrude, allows for the use of all standard processes of photolithography and/or semiconductor technology for exposure and all other necessary process steps.

It is also advantageous to use a substrate which comprises several identical bodies hooked into it, as well as to perform the process steps of the invention simultaneously with several bodies. Such a procedure allows for the execution of a "batch process" in which several coils can be produced simultaneously.

Polyimide that is structured by means of a laser can advantageously be used as the substrate. In this process, structuring by means of the laser applies, in particular, to the shaping of the bodies on a plate-shaped base substrate. The advantage of polyimide is that, due to its permeability, it is well suited for use as a spool and that, furthermore, it is readily available and inexpensive to procure.

Another material that can be used as a substrate is an injection-molded plastic with high temperature resistance, such as liquid crystalline polymers or polyetheretherketone, each of which can be manufactured as a substrate with bodies attached to it by an easily performed and cost-effective injection molding process.

All of the substrate materials mentioned above are plastics, which are advantageous in that they exhibit a high processing temperature, such as that which is required for soldering processes that take place at temperatures >300° C.

In addition, the invention specifies the use of the method described for production of miniaturized coils.

The invention is described below in greater detail on the basis of exemplary embodiments and corresponding figures.

DETAILED DESCRIPTION

Figure 1:
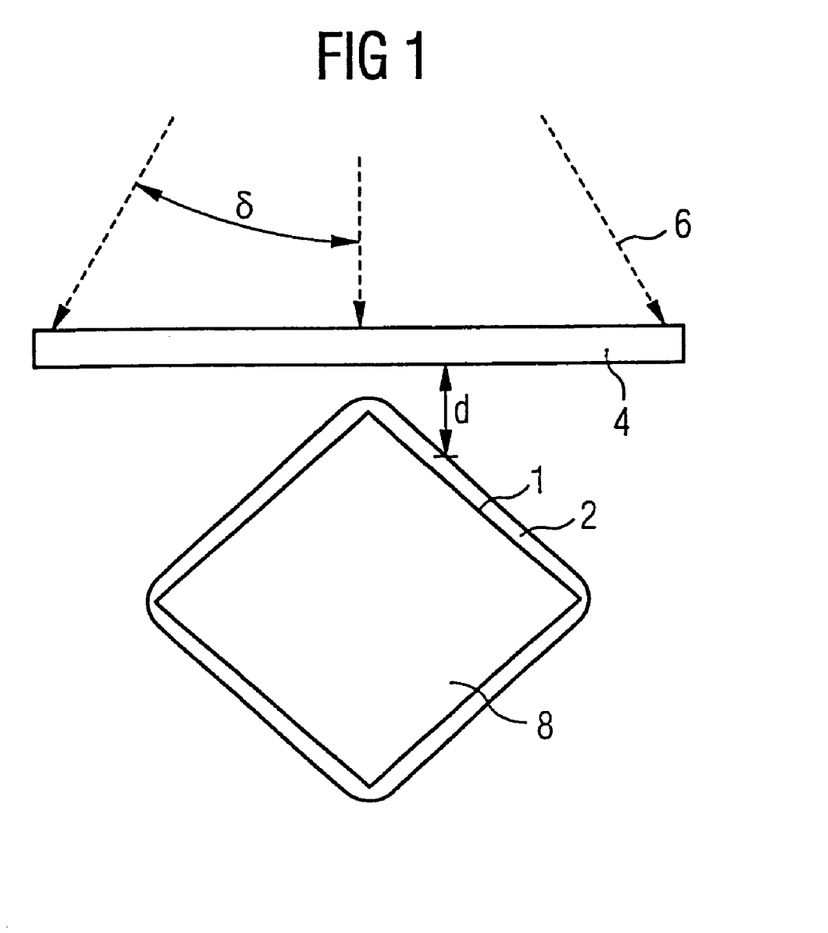
FIG. 1 depicts, in an exemplary manner, the execution of the method according to the invention on the non-planar surface of a body in a schematic cross-section.

FIG. 1 depicts a body 8 with a non-planar surface 1, on which a photosensitive resist coating 2 is electrochemically deposited. A photolithography mask 4 with transparent mask surfaces is imaged onto photosensitive resist coating 2 by a beam cluster 6 which contains light beams having a divergence angle δ. The divergence angle δ applies not only to the depicted surface, but also to the plane vertical to it. Due to the varying distance d between photosensitive resist coating 2 and photolithography mask 4, it is necessary to reduce the mask surfaces on photolithography mask 4 relative to the exposed surfaces on photosensitive resist coating 2.

Figure 2:
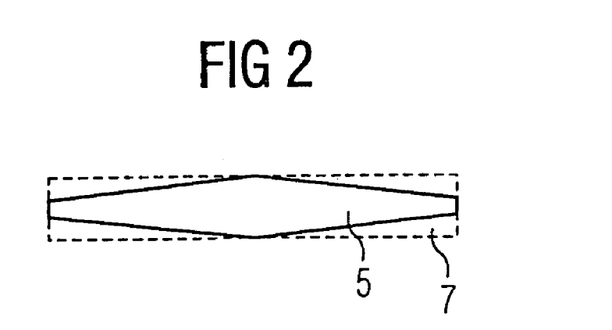
FIG. 2 depicts a mask surface 5, which is reduced in relation to a surface 7 to be exposed.

This procedure is illustrated in FIG. 2 as an aerial view of FIG. 1. A rectangular surface 7 on the upper side of the body 8 to be exposed requires a corresponding reduction in the mask surface 5, whose width decreases outward, i.e., as the distance d increases. As a result, the enlarged image of the mask surface 5 resulting from the divergence of the beam cluster 6 used can be compensated, so that the desired surface 7 to be exposed is ultimately achieved.

The production of coils using the method according to the invention is described below in exemplary fashion.

Figure 3A:
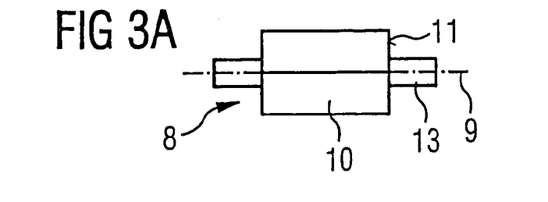
FIGS. 3A and 3B depict, in an aerial view and a lateral view, a body with fastening frames used in the exemplary execution of the method according to the invention.
Figure 3B:
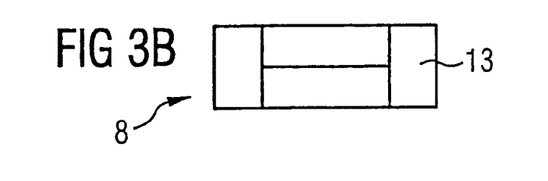
Figure 4:
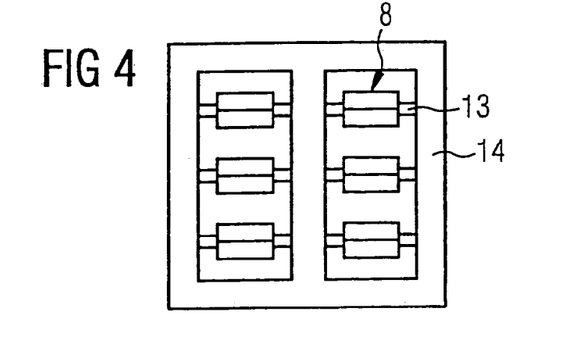
FIG. 4 depicts, in an aerial view, several bodies as depicted in FIG. 3A, which are disposed in a frame.

FIG. 3 depicts the bodies 8 used as spools, which are formed in cubic shapes (cuboids) and have a longitudinal axis 9. The shell surface 10 of the cuboids comprises four rectangles which abut one another a 90° angle. The contact edges are rounded with a radius of curvature of 70 μm. The bodies 8 are attached at their two faces 11 to the frame 14 depicted in FIG. 4 by means of fastening frames 13. The bodies 8 used are 1 mm in length and 650 μm in width, measured diagonally.

Figure 5:
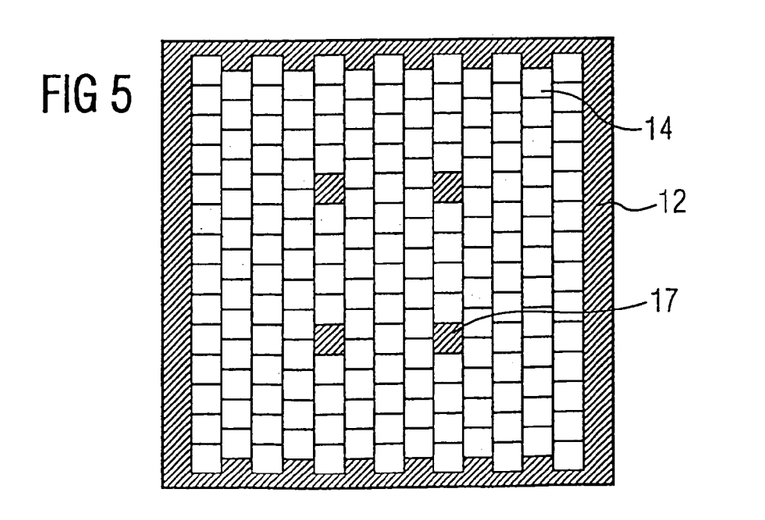
FIG. 5 depicts, in an aerial view, several frames, as depicted in FIG. 4, disposed in a substrate.

The frames 14 are, in turn, combined into the substrate 12 depicted in FIG. 5, wherein the frames 14 are arranged in a web structure to increase the mechanical stability of the substrate 12.

A polyimide compatible with all process steps, such as Cyrlex CL 3000 HN by DuPont, is used as the substrate material. As the initial metal coating described below is the only interface between the substrate and the production process, the process can also be applied to all similar materials onto which the initial metal coating can be deposited with a sufficient degree of adhesion.

The substrates are produced from foils with a thickness of 730 μm laser ablation, and are 3"×3"×730 μm in size. In this regard, FIG. 5 is simply a schematic depiction, especially with respect to the number of frames 14. The substrate 12 used in this example contains 176 elementary cells, each with a size of 5 mm×5 mm. Four of these elementary cells are used as adjustment markers 17, as is necessary for the double-sided photolithography process.

Figure 6A:
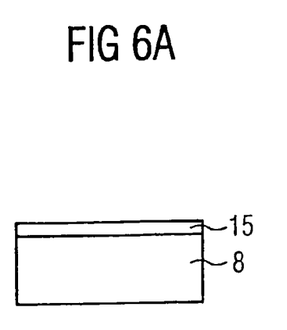
FIG. 6A to FIG. 6F depict, in schematic longitudinal section, the planar portion of a non-planar surface of a body, as depicted in FIG. 1, during the production of an electrically-conductive structure in accordance with the method according to the invention following, in each case, the completion of individual process steps.
Figure 6B:
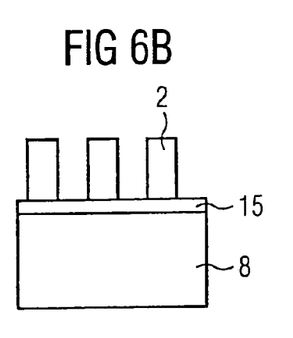
Figure 6C:
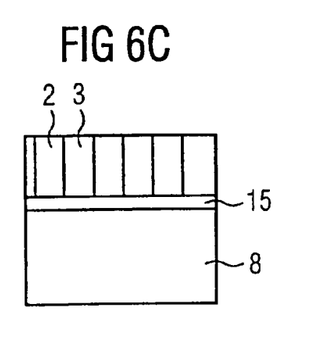
Figure 6D:
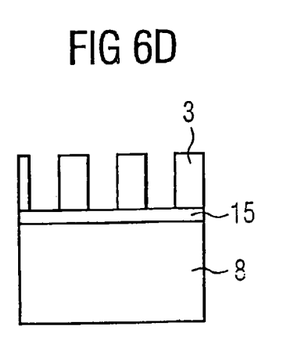
Figure 6E:
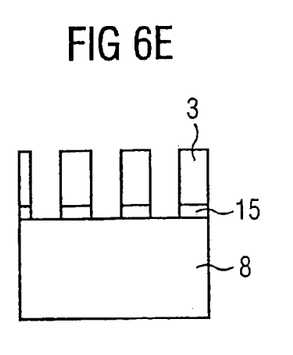
Figure 6F:
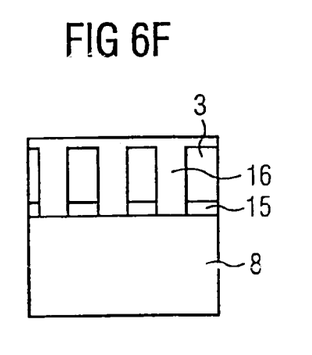

Each of FIGS. 6A to 6F depicts the surface of a body 8 in schematic longitudinal section following the completion of individual process steps that are performed to produce a coil with the body 8 as the spool. FIG. 6A depicts an initial metal coating on the surface of the body 8. FIG. 6B depicts an already-structured photosensitive resist coating 2 on the initial metal coating 15. FIG. 6C depicts the structures of the photosensitive resist coating 2 filled with a conductive material 3. This conductive material 3 can be electrolytically deposited copper. FIG. 6D depicts the body 8 following removal of the photosensitive resist coating 2. FIG. 6E depicts the body 8 following back-etching of the initial metal coating 15. FIG. 6F depicts the body 8 following the application of a protective passivation 16.

The production of the initial metal coating is described below on the basis of FIG. 6A. A standard process for the chemical metal-coating of plastics is known, wherein a metal coating with a thickness of approximately 50 nm is applied by means of palladium seeding and subsequent copper link. To perform the electro-chemical depositing of the coating, the 50 nm metal coating must be reinforced to a thickness of 200 to 300 nm, otherwise the coating will not be deposited with sufficient homogeneity.

Another method of producing an initial metal coating is described below.

A titanium coating with a thickness of 200 μm is deposited onto the substrate by means of DC sputtering. This coating then serves as a bonding agent. The actual so-called seed layer for the photosensitive resist and electroplate, a copper coating with a thickness of 200 nm, is applied onto this coating by means of thermal vacuum evaporation. This metal system has proven to be just as suitable as the chemically deposited copper coating.

The thickness of the initial metal coating should be greater than 200 nm, so that, on the one hand, higher current densities can be used in electrochemical processes and, on the other, the photosensitive resist is deposited with sufficient homogeneity. In addition, improved coverage of side edges is achieved with thicker coatings.

The depositing of the photosensitive resist coating in accordance with FIG. 6B is described below.

In the exemplary method, the photosensitive resist that can be electrochemically deposited is EAGLE 2100 ED, made by Shipley Co. However, it is also possible to use a different suitable photosensitive resist that can be electrochemically deposited.

The results achieved with respect to homogeneity when using conventional coating techniques such as spin-on depositing, dipping or spraying are inadequate.

The photosensitive resist is electrochemically deposited at a temperature of up to 35° C. Stainless steel is used as the anode material, wherein the ratio of the surface of the cathode to that of the anode is approximately 1. To achieve the most homogeneous coating possible, the process is performed with two symmetrical anodes at a distance of 10 cm from the substrate front and back side, and the electrolyte is continuously stirred. The depositing current comprises 300 mA, although it can vary across a wide range and is ultimately limited by the current bearing capacity of the initial metal coating. The depositing process itself lasts only about 30 seconds.

As the photosensitive resist is insulating, the voltage between the cathode and the anode increases exponentially as the thickness of the coating increases during the depositing process. To avoid electrolytic degradation of the photosensitive resist, the voltage is limited to 180 V and the electrolyte is disconnected from the current source once a minimum current of approximately 1–5 mA has been reached. Therefore, and in contrast to electrolytic metal coating, it is not possible to achieve any coating thickness. However, the strength of the coating and/or the depositing process also lies in this insulating behavior, as it naturally results in a homogeneous coating thickness. The coating consistently adheres to the areas with the thinnest photosensitive resist, as this is where the gradient of the line of electric flux is greatest.

The coating thickness can be influenced by means of temperature and by diluting the photosensitive resist with deionized water, which has resulted in coating thicknesses of 4 μm to 25 μm.

At a temperature of 22° C. and a dilution of photosensitive resist+deionized water=2+1, the coating thickness comprises 18±2 μm, which is suitable for this process.

A softbake of 10–20 minutes at 105° C. in a forced-air oven is suitable for planar substrates. The softbake, on the one hand, forces the water from the coating and, on the other, improves adhesion to the substrate. Due to the water loss, however, the coating contracts which, at sharp edges, results in the coating receding in areas with minimal surface curvature, thereby minimizing the inherent surface tension. This proves to be problematic, particularly when coating lateral edges of coils.

To achieve coverage of the coil edges with photosensitive resist, a change in temperature may not occur between coating depositing and electrolytic depositing. To this end, the standard softbake that takes place at 105° C. is replaced by a hardening process at room temperature in a vacuum of 10–5 mbar for 100 minutes.

As the lens of the exposure machine used does not deliver a smooth wave front at the site of the mask, a light beam diverges and reaches the mask through a gap. The divergence results in the formation of a rectangular mask gap with a width b on a gap with a width b'=b+2×d×tan δ. In conventional exposure machines used in planar technology, the light beam divergence δ ranges from approximately 1° to 3°. This light beam divergence can be compensated by replacing a rectangle with width b in the photolithography mask with a trapezoid with side lengths b and b−γ (γ=2×d×tan δ). The value χ=(b−γ)/b is the compensation factor. Using the MA 4 exposure machine manufactured by Karl SUESS KB GmbH & Co., it was possible to effectively compensate the light beam divergence with a χ of 75%.

The photosensitive resist is developed in the developer bath offered by the manufacturer at a temperature of 40±2° C. As the exposed coating structures are highly sensitive to mechanical stress, substrate movements in both the developer bath and during the subsequent development stop in deionized water must be performed very gently and carefully.

To avoid contraction of the photosensitive resist and, therefore, tearing of the photosensitive resist frames along the lateral edge, the substrates are not dried after the development stop, but instead are immediately electroplated. An additional cleaning step prior to electrolytic copper depositing is not necessary.

The depositing of the conductive material 3 in accordance with FIG. 6C is described below.

The standard bath preparation designed for industrial applications, Copper 837 manufactured by Degussa Galvanotechnik GmbH, is used for electrolytic shaping. To achieve the most homogeneous depositing possible, the process is performed with two symmetrical anodes (effective surface area: 5 cm×10 cm) at a distance of 10 cm from the substrate. In addition, nitrogen is continuously blown in to guarantee adequate ion transport and ion concentration compensation.

The copper is deposited at an electrolyte temperature of 22° C. and a current density of 20 mA/cm2. The average depositing rate across the wafer is approximately 0.4 μm/minute, but is lower by a factor of 3 in the areas of the small winding structures. As the sizes of the structures on a spool are virtually identical, a relatively homogeneous depositing rate of 0.1–0.2 μm/minute is achieved on the spools.

The removal of the photosensitive resist coating 2 to produce the process stage depicted in FIG. 6D is described below.

The photosensitive resist structures can, for the most part, be removed with Remover MP 1165 manufactured by micro resist technology GmbH. Removal can be accelerated by heating the remover to 50° C. There are several other organic removers that can be used here. The organic removers are effective because they do not attack the copper in the strip conductors.

Thorough removal of the photosensitive resist structures is especially important because photosensitive resist residues, which are resistant to electropolishing and hydrofluoric acid, prevent back-etching of the initial metal coating. Consequently, the wafers are exposed to brief oxygen plasma following the remover bath, and are subsequently boiled in acetone.

The back-etching of the initial metal coating 15 to produce the process stage depicted in FIG. 6E is described below The seed layer of the initial metal coating, the 200 nm copper coating, is removed in an electropolishing step. The advantage of this procedure is that the surface of the copper winding is polished at the same time. A type 6100 industrial electropolishing bath manufactured by Degussa Galvanotechnik GmbH was used. To this end, the substrate is polished for 30 seconds at current of 9.0 A.

The titanium coating with a thickness of 200 nm can be etched in a 1% hydrofluoric acid solution. This attacks neither the copper windings nor the polyimide, and for this reason this process is non-critical. The reaction begins after approximately 1 minute with substantial gas development, when the natural titanium oxide (1 nm) was etched. The titanium coating is completely removed after approximately 3 minutes.

Following an electropolishing step, the chemically deposited initial metal coating can be completely removed in a solution of sulfuric acid (10% vol.) and hydrogen peroxide (1% vol.) in about 10 seconds.

The application of the protective passivation depicted in FIG. 6F is described below.

To integrate the depositing of the protective passivation 16 into the batch process, the coils should be protected with either a photosensitive polyimide or with the SU8 negative coating known in microsystem technology. This ensures that the protective passivation can be deposited onto the entire surface of the substrate and, in a subsequent photolithography step, can be opened at the contact points and/or faces.

Four different coils were produced using the method described above. Coil 06 and coil 07 feature N=6.8 turns and an inductivity L of 11.4 nH. Coil 08 features N=7.6 turns and an inductivity L=14.5 nH. Coil 08 features N=9.2 turns and an inductivity L=21.2 nH. The inductivities all apply at 100 MHz.

Figure 7:
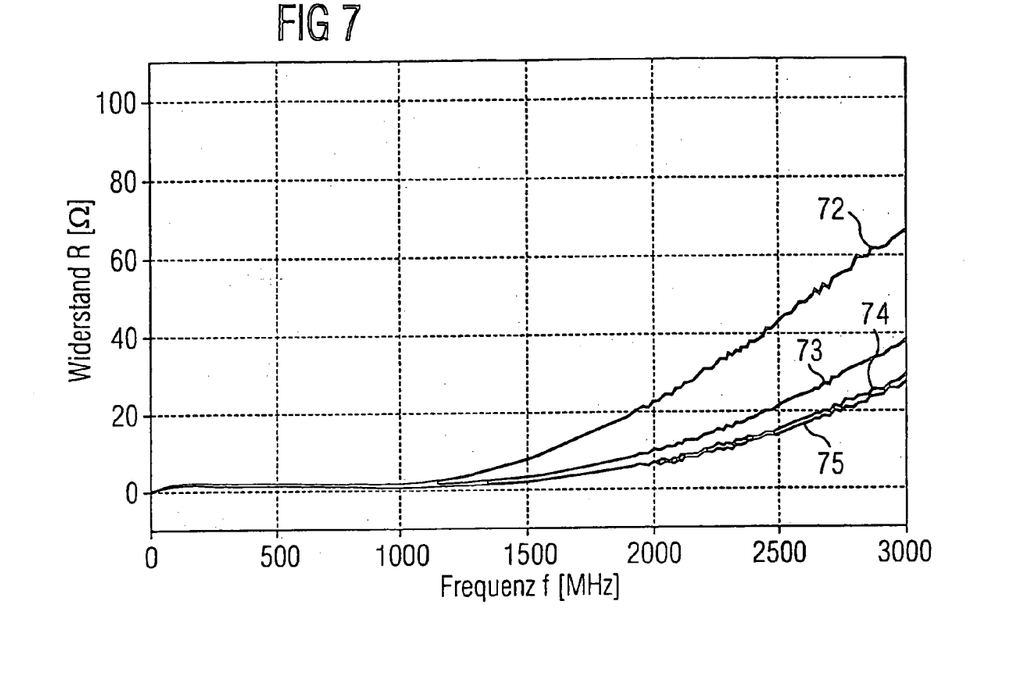
FIGS. 7 to 9 depict electric readings for coils produced in accordance with the method according to the invention.

FIG. 7 depicts the electrical resistance of the four coils. The DC current resistance is approximately 0.5 W for all coils. The resistance begins to increase drastically starting at a frequency of one GHz.

Test curve 72 depicts the resistance for coil 11, test curve 73 the resistance for coil 08, test curve 74 the resistance for coil 07 and, finally, test curve 75 the resistance for coil 06.

Figure 8:
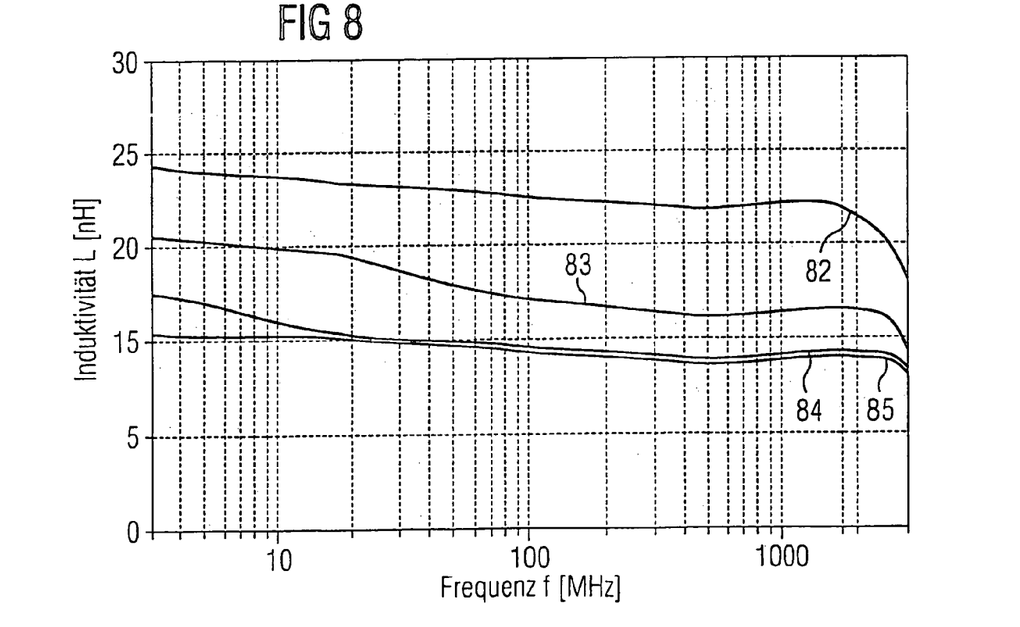

FIG. 8 depicts the measured inductivity of the coils with inductivity values at a typical test frequency of 100 MHz. Test curve 82 depicts the inductivity for coil 11, test curve 83 the inductivity for coil 08, test curve 84 the inductivity for coil 07, and test curve 85 the inductivity for coil 06.

Another important parameter of inductivity is its quality, which is calculated as the quotient of the imaginary portion to the real portion of the complex impedance.

Figure 9:
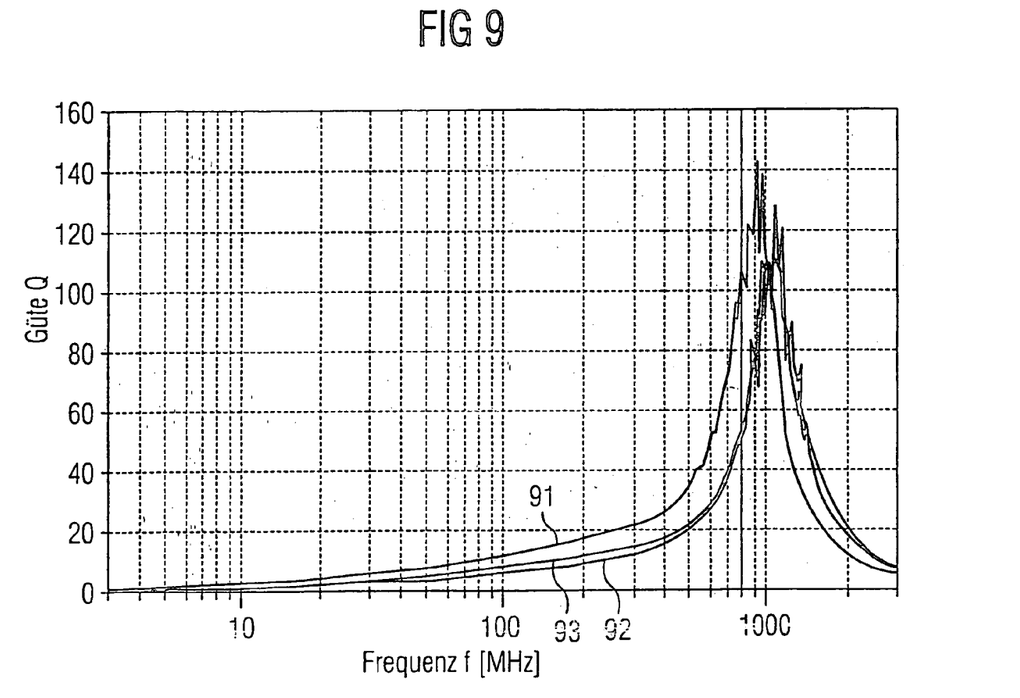

FIG. 9 depicts the qualities of the coils produced using the method described above. Curve 91 depicts the quality of coil 11, curve 93 the quality of coils 07 and 06, which cannot be differentiated from one another on the scale used, and curve 92 depicts the quality of coil 08.

It is critical to the invention that the electrochemical and/or chemical processes for depositing of the photosensitive resist coating and, advantageously, for the initial metal-coating process are used. As a result, advantages with respect to coating homogeneity are achieved on three-dimensional surfaces, especially on surfaces with edges, in comparison with directed methods such as sputtering or vacuum evaporation.

The invention is not limited to the exemplary embodiments described, but is instead defined in its most general form by claim 1.

What is claimed is:

1. A method for producing an electrically conductive structure on a non-planar surfaces, comprising:
    depositing a photosensitive resist coating onto the non-planar surface;
    exposing the photosensitive resist coating, wherein exposing the photosensitive resist coating comprises imaging a photolithography mask with a transparent mask surface using a divergent beam cluster, and wherein a mask surface of the photolithography mask is smaller than a surface of the photosensitive resist coating being exposed;
    removing a portion of the photosensitive resist coating; and
    depositing an electrically-conductive material onto portions of the non-planar surface that are substantially free of the photosensitive resist coating.

2. The method according to claim 1, wherein the photosensitive resist coating has a thickness that varies by less than 25% across the non-planar surface.

3. The method according to claim 1, wherein the photosensitive resist coating has a thickness between 10 $\mu$m and 50 $\mu$m.

4. The method according to claim 1, wherein the divergent beam cluster comprises light beams having a divergence of less than 10 mrad.

5. The method according to claim 1, wherein:
    the divergent beam cluster has a divergence angle $\delta$; and
    a surface of the photosensitive resist coating being exposed has a reference width $b_1$ at a distance d, and the mask surface has a width $b_2$ at the distance d that diverges by less than 10% from a width $b_3$ that is determined in accordance with the following formula:

$b_3 = b_1 - 2 \times d \times \tan \delta$.

6. The method according to claim 5, wherein:
    the electrically-conductive structure is deposited on the non-planar surface of a body with a longitudinal axis, a shell surface, and a face; and
    the body is oriented during exposing so that at least half of the shell surface is exposed.

7. The method according to claim 6, wherein the body is oriented during exposing so that flat surfaces of the shell surface have an angle of at least 40° relative to a beam direction of the divergent beam cluster.

8. The method according to claim 7, wherein the body is cubical and has contact edges between lateral surfaces of the shell surface, the contact edges being rounded.

9. The method according to claim 8, wherein the body is exposed from two sides so that the electrically-conductive structure becomes a strip conductor which runs at least once around the longitudinal axis of the body.

10. The method according to claim 9, wherein the body is attached to a two-dimensional substrate by a fastening frame.

11. The method according to claim 8, wherein:
    the body is attached to a substrate that is attached to several identical bodies; and
    the method is performed simultaneously using several of the identical bodies.

12. The method according to claim 11, wherein the substrate comprises polyimide that is structured by a laser.

13. The method according to claim 11, wherein the substrate comprises an injection-molded plastic with high temperature resistance.

14. The method according to claim 1, further comprising depositing an initial metal coating on the substrate prior to depositing the photosensitive resist coating.

15. The method of claim 1 used to produce miniaturized coils.

16. A method for producing an electrically conductive structure on a non-planar surface, comprising:
    depositing a photosensitive resist coating onto the non-planar surface;
    exposing the photosensitive resist coating, wherein exposing the photosensitive resist coating comprises imaging a photolithography mask with a transparent mask surface using a single divergent beam cluster originating from a single source, wherein a mask surface of the photolithography mask is smaller than a surface of the photosensitive resist coating being exposed, and wherein a size of the mask surface is dictated by a distance between the photolithography mask and the photosensitive resist coating during exposure; and
    depositing an electrically-conductive material onto portions of the non-planar surface that are substantially free of the photosensitive resist coating.

17. The method according to claim 16, wherein:
    the divergent beam cluster has a divergence angle $\delta$; and
    a surface of the photosensitive resist coating being exposed has a reference width $b_1$ at a distance d between the photolithography mask and the photosensitive resist coating, and the mask surface has a width $b_2$ at the distance d that diverges by less than 10% from a width $b_3$ that is determined in accordance with the following formula:

$b_3 = b_1 - 2 \times d \times \tan \delta$.

18. The method according to claim 17, wherein:
    the electrically-conductive structure is deposited on the non-planar surface of a body with a longitudinal axis, a shell surface, and a face; and
    the body is oriented during exposing so that at least half of the shell surface is exposed.

19. The method according to claim 18, wherein the body is attached to a two-dimensional substrate by a fastening frame.

20. The method according to claim 16, wherein the photosensitive resist coating has a thickness that varies by less than 25% across the non-planar surface; and
    wherein the photosensitive resist coating has a thickness between 10 $\mu$m and 50 $\mu$m.

* * * * *

UNITED STATES PATENT AND TRADEMARK OFFICE
CERTIFICATE OF CORRECTION

PATENT NO. : 6,998,222 B2
APPLICATION NO. : 10/380293
DATED : February 14, 2006
INVENTOR(S) : Florian Wiest and Ignaz Eisele It is certified that error appears in the above-identified patent and that said Letters Patent is hereby corrected as shown below:

On title page, in column 1,
item
--(30)   Foreign Application Priority Data
   September 12, 2000    (DE)...........10045072.5--

Signed and Sealed this

Fifteenth Day of August, 2006

JON W. DUDAS
*Director of the United States Patent and Trademark Office*